(12) United States Patent
Veches et al.

(10) Patent No.: US 10,083,937 B2
(45) Date of Patent: Sep. 25, 2018

(54) SEMICONDUCTOR DEVICES AND PACKAGES AND METHODS OF FORMING SEMICONDUCTOR DEVICE PACKAGES

(71) Applicant: Micron Technology, Inc., Boise, ID (US)

(72) Inventors: Anthony D. Veches, Boise, ID (US); William R. Stephenson, Nampa, ID (US); Walter L. Moden, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 15/354,467

(22) Filed: Nov. 17, 2016

(65) Prior Publication Data

US 2017/0069603 A1    Mar. 9, 2017

Related U.S. Application Data

(62) Division of application No. 14/613,636, filed on Feb. 4, 2015, now Pat. No. 9,502,369.

(51) Int. Cl.
*H01L 25/065* (2006.01)
*H01L 23/00* (2006.01)
(Continued)

(52) U.S. Cl.
CPC ...... *H01L 25/0657* (2013.01); *H01L 21/0228* (2013.01); *H01L 21/2007* (2013.01);
(Continued)

(58) Field of Classification Search
None
See application file for complete search history.

(56) References Cited

U.S. PATENT DOCUMENTS

| 6,847,105 B2 | 1/2005 | Koopmans |
| 7,071,421 B2 | 7/2006 | Heng et al. |

(Continued)

OTHER PUBLICATIONS

Carson et al., Die to Die Copper Wire Bonding Enabling Low Cost 3D Packaging, Electronic components and Technology Conference, (2011), pp. 1501-1507.
(Continued)

*Primary Examiner* — Ermias Woldegeorgis
(74) *Attorney, Agent, or Firm* — TraskBritt (57) ABSTRACT

Semiconductor device packages include first and second semiconductor dice in a facing relationship. At least one group of solder bumps is substantially along a centerline between the semiconductor dice and operably coupled with integrated circuitry of the first and second semiconductor dice. Another group of solder bumps is laterally offset from the centerline and operably coupled only with integrated circuitry of the first semiconductor die. A further group of solder bumps is laterally offset from the centerline and operably coupled only with integrated circuitry of the second semiconductor die. Methods of forming semiconductor device packages include aligning first and second semiconductor dice with active surfaces facing each other, the first and second semiconductor dice each including bond pads along a centerline thereof and additional bond pads laterally offset from the centerline thereof.

20 Claims, 3 Drawing Sheets

(51) Int. Cl.
*H01L 25/00* (2006.01)
*H01L 23/495* (2006.01)
*H01L 21/02* (2006.01)
*H01L 23/31* (2006.01)
*H01L 21/20* (2006.01)
*H01L 27/1157* (2017.01)
*H01L 23/488* (2006.01)

(52) U.S. Cl.
CPC ...... *H01L 23/3114* (2013.01); *H01L 23/3142* (2013.01); *H01L 23/488* (2013.01); *H01L 23/4951* (2013.01); *H01L 23/4952* (2013.01); *H01L 24/03* (2013.01); *H01L 24/06* (2013.01); *H01L 24/17* (2013.01); *H01L 24/49* (2013.01); *H01L 24/73* (2013.01); *H01L 24/81* (2013.01); *H01L 24/85* (2013.01); *H01L 24/92* (2013.01); *H01L 25/50* (2013.01); *H01L 27/1157* (2013.01); *H01L 2224/0401* (2013.01); *H01L 2224/16148* (2013.01); *H01L 2224/17177* (2013.01); *H01L 2224/32225* (2013.01); *H01L 2224/45139* (2013.01); *H01L 2224/45144* (2013.01); *H01L 2224/45147* (2013.01); *H01L 2224/48091* (2013.01); *H01L 2224/48108* (2013.01); *H01L 2224/48149* (2013.01); *H01L 2224/48227* (2013.01); *H01L 2224/73207* (2013.01); *H01L 2224/73253* (2013.01); *H01L 2224/8112* (2013.01); *H01L 2224/92127* (2013.01); *H01L 2225/0651* (2013.01); *H01L 2225/06513* (2013.01)

(56) References Cited

U.S. PATENT DOCUMENTS

| | | |
|---|---|---|
| 7,189,593 B2 | 3/2007 | Lee |
| 7,276,790 B2 | 10/2007 | Seng et al. |
| 7,663,232 B2 | 2/2010 | Kinsley |
| 7,985,631 B2 | 7/2011 | Zhang |
| 8,384,200 B2 | 2/2013 | Seng et al. |
| 8,394,672 B2 | 3/2013 | Su et al. |
| 9,269,695 B2 | 2/2016 | Seng et al. |
| 2002/0031864 A1 | 3/2002 | Ball |
| 2003/0057539 A1* | 3/2003 | Koopmans ............ H01L 23/13 257/686 |
| 2005/0045378 A1* | 3/2005 | Heng ................. H01L 25/0657 174/260 |
| 2006/0022323 A1 | 2/2006 | Seng |
| 2007/0194415 A1* | 8/2007 | Seng ................... H01L 25/0657 257/678 |
| 2016/0225734 A1 | 8/2016 | Veches et al. |

OTHER PUBLICATIONS

Chylak et al., Advanced Ultra-Low-Loop Wire Bonds, SEMICON China (2006), 5 pages.

Haba, Bridging Between 3D and 3D TSV Stacking Technologies, 2013 Bits Workshop, Mar. 3-6, 2013, 30 pages.

* cited by examiner

United States Patent document

SEMICONDUCTOR DEVICES AND PACKAGES AND METHODS OF FORMING SEMICONDUCTOR DEVICE PACKAGES

CROSS-REFERENCE TO RELATED APPLICATION

This application is a divisional of U.S. patent application Ser. No. 14/613,636, filed Feb. 4, 2015, now U.S. Pat. No. 9,502,369, issued Nov. 22, 2016, the disclosure of which is hereby incorporated herein in its entirety by this reference.

FIELD

Embodiments of the present disclosure relate to semiconductor devices and packages and methods of forming such semiconductor devices and packages. Some embodiments relate to semiconductor device packages including two semiconductor dice arranged face-to-face.

BACKGROUND

Conventional semiconductor device packages include multiple semiconductor dice that are stacked, partially overlapping, side-by-side, or on opposite sides of an interposer substrate. Such packages have enabled the semiconductor industry to fit more computer memory or processing capabilities into a smaller physical area, compared to assemblies of multiple semiconductor devices each including only one semiconductor die.

Some conventional semiconductor device packages include two semiconductor dice stacked in a face-to-face arrangement (i.e., with active surfaces facing each other). Each of the two semiconductor dice may include a unique—to-each-die so-called "redistribution layer," commonly termed an "RDL," of conductive traces on an active surface of each semiconductor die to route respective electrical contacts of each of the two semiconductor dice to locations on the semiconductor dice, such as proximate outer edges of the semiconductor dice, that are convenient for bonding wires or other electrical access elements extending to an interposer substrate or to higher-level packaging. In other arrangements, conductive elements commonly referred to as "through silicon vias" or "TSVs" form an electrical pathway through a thickness of at least one of the two semiconductor dice for electrically accessing one or both of the two semiconductor dice. In either case, forming the redistribution layers or the TSVs requires additional processing operations, time, and cost.

DETAILED DESCRIPTION

The following description provides specific details, such as material types, material thicknesses, and processing conditions in order to provide a thorough description of embodiments of the present disclosure. However, a person of ordinary skill in the art will understand that the embodiments of the present disclosure may be practiced without employing these specific details. Indeed, the embodiments of the present disclosure may be practiced in conjunction with conventional fabrication techniques and materials employed in the industry.

The fabrication processes described herein do not describe a complete process flow for processing semiconductor structures. The remainder of the process flow is known to those of ordinary skill in the art. Accordingly, only the methods and memory device structures necessary to understand embodiments of the present disclosure are described herein.

In the following detailed description, reference is made to the accompanying drawings, which form a part hereof, and in which is shown, by way of illustration, specific embodiments in which the present disclosure may be practiced. These embodiments are described in sufficient detail to enable a person of ordinary skill in the art to practice the present disclosure. However, other embodiments may be utilized, and structural, logical, and electrical changes may be made without departing from the scope of the disclosure. The illustrations presented herein are not meant to be actual views of any particular system, device, structure, or process, but are idealized representations that are employed to describe the embodiments of the present disclosure. The drawings presented herein are not necessarily drawn to scale.

As used herein, the term "substantially" in reference to a given parameter, property, or condition means and includes to a degree that one skilled in the art would understand that the given parameter, property, or condition is met with a small degree of variance, such as within acceptable manufacturing tolerances. For example, a parameter that is substantially met may be at least about 90% met, at least about 95% met, or even at least about 99% met.

As used herein, any relational term, such as "first," "second," "third," "fourth," "over," "top," etc., is used for clarity and convenience in understanding the disclosure and accompanying drawings and does not connote or depend on any specific preference, orientation, or order, except where the context clearly indicates otherwise.

As used herein, the term "forming" means and includes any method of creating, building, or depositing a material. For example, forming may be accomplished by atomic layer deposition (ALD), chemical vapor deposition (CVD), physical vapor deposition (PVD), sputtering, co-sputtering, spin-coating, diffusing, depositing, growing, or any other technique known in the art of semiconductor fabrication. Depending on the specific material to be formed, the technique for forming the material may be selected by a person of ordinary skill in the art.

The embodiments of the present disclosure include semiconductor device packages including two semiconductor devices (e.g., dice) arranged face-to-face (i.e., with active surfaces facing each other). At least some bond pads and associated solder bumps are located in one or more rows along respective centerlines of the two semiconductor devices. In some embodiments, bond pads and solder bumps configured to transmit at least data signals to the two semiconductor devices are laterally offset from the respective centerlines of the two semiconductor devices. The laterally offset bond pads may enable unique electrical interaction with each of the two semiconductor devices without forming different redistribution layers on each of the two semiconductor devices to enable proper signal routing. Accordingly, in some embodiments, each of the two semiconductor devices in the semiconductor package has substantially the same circuitry layout as the other of the two semiconductor devices.

Figure 1:
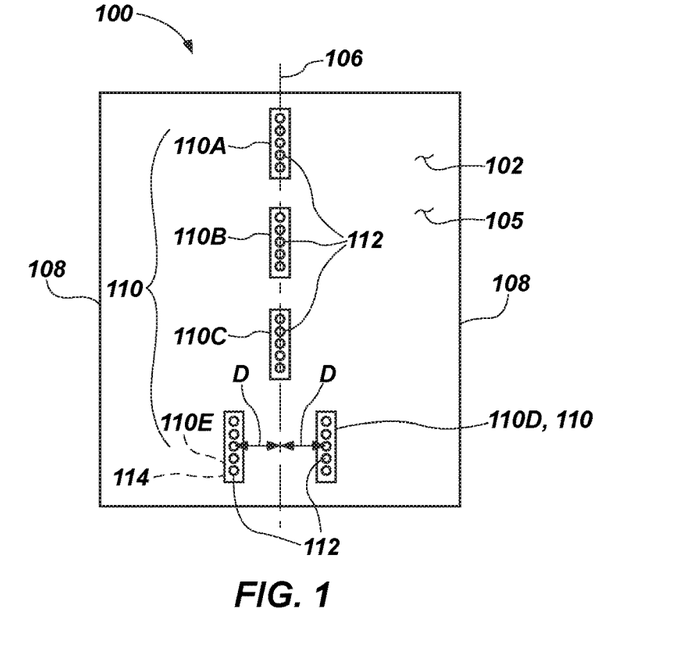
FIG. 1 shows a plan view of a first semiconductor device according to an embodiment of the present disclosure.

FIG. 1 shows a first semiconductor device 100 (also referred to as a semiconductor die 100) that may include an active surface 102 and a back side surface 104 (see FIG. 3A) opposite the active surface 102. The active surface 102 may be at least partially covered by a passivation material 105. A centerline 106 of the first semiconductor device 100 is located substantially midway between and parallel to opposing lateral edges 108 of the first semiconductor device 100. Bond pads 110 may be positioned on or at least partially in the active surface 102 and may not be covered by the passivation material 105, to provide electrical access to integrated circuitry of the first semiconductor device 100. At least some of the bond pads 110 may be positioned along the centerline 106 of the first semiconductor device 100. For example, one or more of address bond pads 110A, power bond pads 110B, and command bond pads 110C may be positioned along the centerline 106. Other bond pads 110, such as data bond pads 110D (also known as "DQ" bond pads), may be laterally offset a distance D from the centerline 106.

Figure 1A:
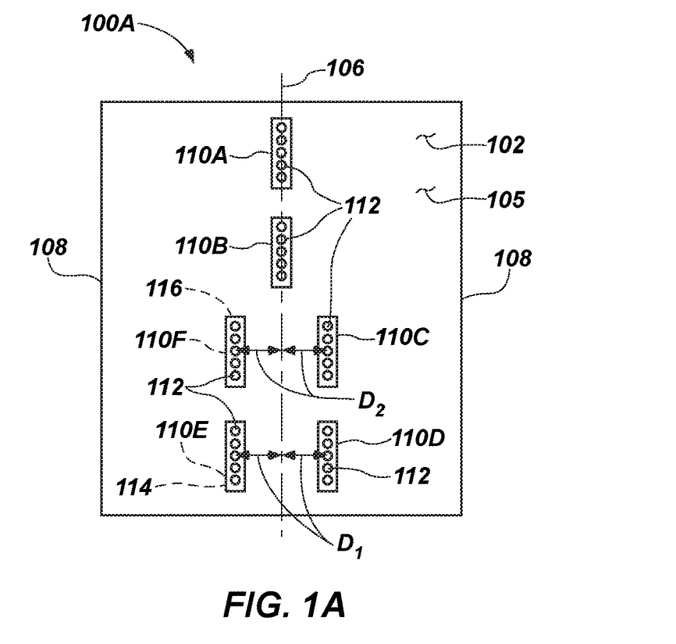
FIG. 1A shows a plan view of another embodiment of a semiconductor device according to the present disclosure.

In some embodiments, the command bond pads 110C may also be offset from the centerline 106, rather than along the centerline 106. For example, FIG. 1A illustrates another embodiment of a semiconductor device 100A that is similar to the first semiconductor device 100 described with reference to FIG. 1, except that both the data bond pads 110D and the command bond pads 110C of the semiconductor device 100A are laterally offset from the centerline 106, as shown in FIG. 1A. The data bond pads 110D may be laterally offset from the centerline 106 a distance $D_1$, and the command bond pads 110C may be laterally offset from the centerline 106 a distance $D_2$. The distance $D_2$ may or may not be substantially the same as the distance $D_1$.

Referring again to FIG. 1, although each of the address bond pads 110A, power bond pads 110B, command bond pads 110C, and data bond pads 110D is represented in FIG. 1 as a single rectangle for simplicity, in reality each group of bond pads 110 includes a row of multiple individual bond pads 110 to provide a number of unique electrical connections to the first semiconductor device 100. Each group of bond pads 110 (e.g., the address bond pads 110A, power bond pads 110B, command bond pads 110C, and data bond pads 110D) is also referred to herein as a set of bond pads 110.

The first semiconductor device 100 may be any semiconductor device 100 that may be positioned in a semiconductor device package in a face-to-face orientation, as is known by one of ordinary skill in the art. By way of non-limiting example, the first semiconductor device 100 may be a dynamic random access memory ("DRAM") device, a NAND Flash memory device, or a graphics device. Integrated circuitry of the first semiconductor device 100 may vary depending on the type of the first semiconductor device 100.

Solder bumps 112 may be located over respective bond pads 110. For simplicity and clarity, FIG. 1 illustrates five solder bumps 112 over the address bond pads 110A, five solder bumps 112 over the power bond pads 110B, five solder bumps 112 over the command bond pads 110C, and five solder bumps 112 over the data bond pads 110D. However, any number of solder bumps 112 corresponding to individual bond pads 110 may be located over each group of bond pads 110, depending on the number of unique electrical communication pathways needed or desired for a particular type, density, and size of the first semiconductor device 100.

Solder bumps 112 may also be located over an electrically isolated region 114, as shown in FIG. 1. The electrically isolated region 114 may be laterally offset from the centerline 106 substantially the same distance D that the data bond pads 110D are laterally offset from the centerline 106. The electrically isolated region 114 and the data bond pads 110D may be positioned on opposite sides of the centerline 106, and at substantially the same longitudinal location and lateral distance D from the centerline 106 along a length of the centerline 106. In other words, the data bond pads 110D and the electrically isolated region 114 may be on opposite sides of a same longitudinal section of the centerline 106. The solder bumps 112 over the electrically isolated region 114 may be positioned directly on the passivation material 105, or, optionally, over one or more dummy bond pads 110E on the passivation material 105, which are electrically isolated from (i.e., not electrically connected to) the integrated circuitry of the first semiconductor device 100. The one or more dummy bond pads 110E, if present, may be formed of the same material and at the same time as the address bond pads 110A, power bond pads 110B, command bond pads 110C, and data bond pads 110D. The solder bumps 112 in the electrically isolated region 114 are present to provide physical support to solder bumps 112 of another semiconductor device to be packaged in a face-to-face orientation with the first semiconductor device 100, as will be explained in detail below.

Referring again to FIG. 1A, in embodiments in which the command bond pads 110C are laterally offset from the centerline 106, solder bumps 112 may also be located over another electrically isolated region 116. The electrically isolated region 116 may be laterally offset from the centerline 106 the same distance $D_2$ that the command bond pads 110C are laterally offset from the centerline 106. The electrically isolated region 116 and the command bond pads 110C may be positioned on opposite sides of the centerline 106 and at substantially the same longitudinal location and lateral distance $D_2$ from the centerline 106 along a length of the centerline 106. In other words, the command bond pads 110C and the electrically isolated region 116 may be on opposite sides of a same longitudinal section of the centerline 106. The solder bumps 112 over the electrically isolated region 116 may be positioned directly on the passivation material 105 or, optionally, over one or more dummy bond pads 110F on the passivation material 105, which are electrically isolated from (i.e., not electrically connected to) the integrated circuitry of the first semiconductor device 100A. The one or more dummy bond pads 110F, if present, may be formed of the same material and at the same time as the address bond pads 110A, power bond pads 110B, command bond pads 110C, data bond pads 110D, and, if present, the one or more dummy bond pads 110E. The solder bumps 112 in the electrically isolated region 116 are present to provide physical support to solder bumps 112 of another semiconductor device to be packaged in a face-to-face orientation with the first semiconductor device 100.

Figure 2:
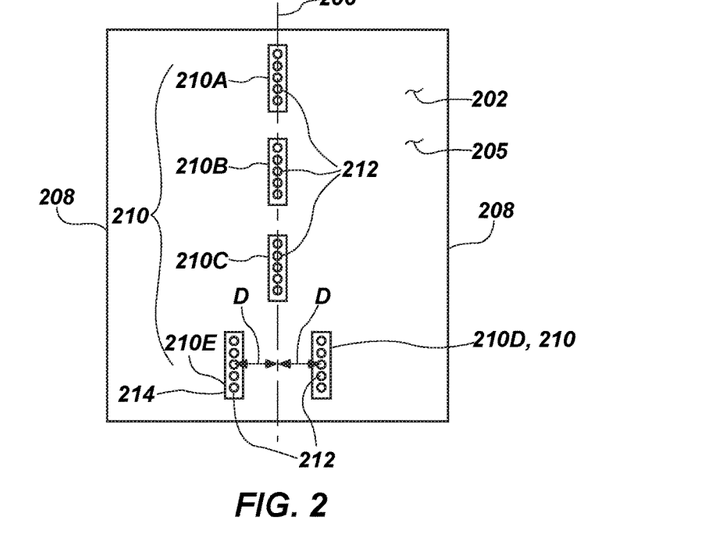
FIG. 2 shows a plan view of a second semiconductor device according to an embodiment of the present disclosure.

Referring to FIG. 2, a second semiconductor device 200 may be sized, shaped, and configured substantially the same as the first semiconductor device 100 (FIG. 1). For example, the second semiconductor device 200 may include an active surface 202 and a back side surface 204 (see FIG. 3A) opposite the active surface 202. The active surface 202 may be at least partially covered by a passivation material 205. A centerline 206 of the second semiconductor device 200 may be located substantially midway between and parallel to opposing lateral edges 208 of the second semiconductor device 200. Bond pads 210 may be positioned on or at least partially in the active surface 202 and may not be covered by the passivation material 205, to provide electrical access to integrated circuitry of the second semiconductor device 200. At least some of the bond pads 210 may be positioned along the centerline 206 of the second semiconductor device 200. For example, one or more of address bond pads 210A, power bond pads 210B, and command bond pads 210C may be positioned along the centerline 206. Other bond pads 210, such as data bond pads 210D (also known as "DQ" bond pads), may be laterally offset the distance D from the centerline 206. The second semiconductor device 200 may also include an electrically isolated region 214 laterally offset from the centerline 206 at substantially the same longitudinal location along a length of the centerline 206 and on the opposite side of the centerline 206 from the data bond pads 210D. The electrically isolated region 214 may be defined over a portion of the passivation material 205 or, optionally, may include one or more dummy bond pads 210E formed on the passivation material 105, and which are electrically isolated (i.e., not electrically connected) to the integrated circuitry of the second semiconductor device 200. Solder bumps 212 may be positioned over the bond pads 210 and over the electrically isolated region 214 (and, optionally, over the one or more dummy bond pads 210E).

Referring to FIG. 1 and FIG. 2, as noted above the second semiconductor device 200 may be sized, shaped and configured substantially the same as the first semiconductor device 100, and both the first semiconductor device 100 and the second semiconductor device 200 may include substantially the same circuitry layout, including the integrated circuitry thereof. In additional embodiments, the second semiconductor device 200 may not include the solder bumps 212 and electrical connections to the bond pads 210 of the second semiconductor device 200 may be formed using only the solder bumps 112 of the first semiconductor device 100 upon assembly of the first and second semiconductor devices 100, 200 into a semiconductor device package, as described below.

Figure 3A:
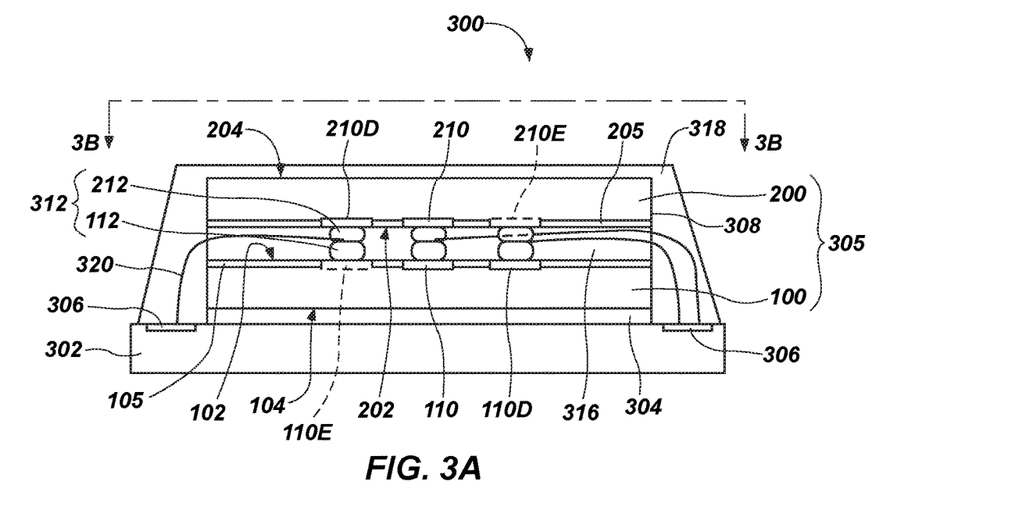
FIG. 3A shows a cross-sectional view of a semiconductor device package according to an embodiment of the present disclosure, taken from line 3A-3A of FIG. 3B.
Figure 3B:
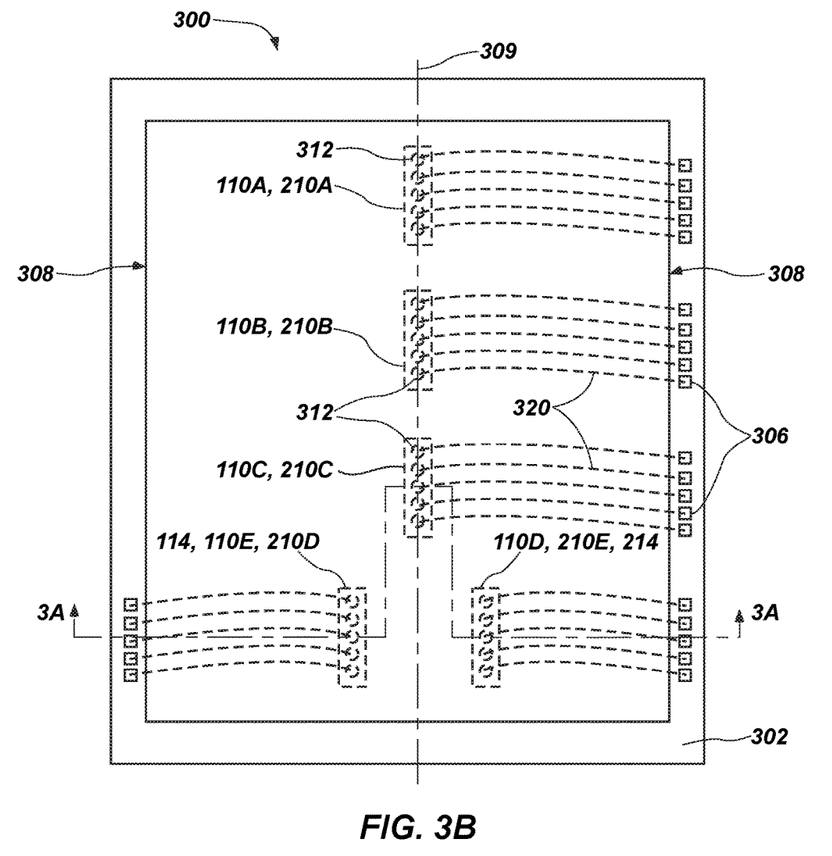
FIG. 3B shows a plan view of the semiconductor device package of FIG. 3A, taken from line 3B-3B of FIG. 3A.

FIGS. 3A and 3B illustrate a semiconductor device package 300 that includes the first semiconductor device 100 and the second semiconductor device 200 arranged in a face-to-face orientation, with the active surface 102 of the first semiconductor device 100 facing the active surface 202 of the second semiconductor device 200. FIG. 3A is a cross-sectional view of the semiconductor device package 300 taken from line 3A-3A of FIG. 3B, and FIG. 3B is a plan view of the semiconductor device package 300 taken from line 3B-3B of FIG. 3A. Features that are obscured by the second semiconductor device 200 in the view of FIG. 3B are shown in dashed lines.

Referring to FIGS. 3A and 3B, the semiconductor device package 300 may include the first semiconductor device 100 positioned over a substrate 302, such as an interposer substrate, a leadframe, or a circuit board, with an adhesive material 304, which may comprise a dielectric material such as an underfill material, between the back side 104 of the first semiconductor device 100 and the substrate 302. The second semiconductor device 200 may be aligned with and positioned over the first semiconductor device 100 to form a two-die stack 305 over the substrate 302. The substrate 302 may include conductive pads 306 positioned proximate one or more lateral edges 308 of the two-die stack 305. A centerline 309 (FIG. 3B) of the two-die stack 305 may be defined generally midway between opposing lateral edges 308 of the two-die stack 305. The solder bumps 112 of the first semiconductor device 100 and the solder bumps 212 of the second semiconductor device 200 may be aligned to form physical and electrical connections therebetween. Since the solder bumps 112, 212 may be heated and reflowed to form an electrical and physical connection, as is known in the art, each respective pair of solder bumps 112, 212 of the semiconductor device package 300 is also referred to herein as "a conductive solder bump 312" in singular form. Thus, the phrase "a conductive solder bump 312," when used in reference to the semiconductor device package 300, refers to a pair of connected solder bumps 112, 212, and the phrase "conductive solder bumps 312" collectively refers to pairs of connected solder bumps 112, 212 of the semiconductor device package 300.

Conductive bond wires 320 (e.g., wires comprising gold, copper, or silver) may be physically and electrically connected to and extend between the conductive pads 306 of the substrate 302 and the conductive solder bumps 312 extending between the first and second semiconductor devices 100, 200, rather than physically contacting the bond pads 110 of the first semiconductor device 100 or the bond pads 210 of the second semiconductor device 200.

As shown in FIGS. 3A and 3B in conjunction with FIGS. 1 and 2, the solder bumps 112, 212 that are aligned with the respective centerlines 106, 206 of the first and second semiconductor devices 100, 200 may be aligned with the centerline 309 of the two-die stack 305 of the semiconductor device package 300. Accordingly, the solder bumps 212 along the centerline 206 of the second semiconductor device 200 (e.g., the solder bumps 212 over the address bond pads 210A, over the power bond pads 210B, and over the command bond pads 210C) may be aligned with the solder bumps 112 along the centerline 106 of the first semiconductor device 100 (e.g., the solder bumps 112 over the address bond pads 110A, over the power bond pads 110B, and over the command bond pads 110C) to form central conductive solder bumps 312 of the semiconductor device package 300.

Due to the lateral offset from the centerline 106 of the electrically isolated region 114 (and, optionally, the one or more dummy bond pads 110E) of the first semiconductor device 100 and the lateral offset from the centerline 206 of the data bond pads 210D of the second semiconductor device 200 (see FIGS. 1 and 2), the solder bumps 212 over the data bond pads 210D of the second semiconductor device 200 may be aligned with and physically and electrically coupled to the solder bumps 112 over the electrically isolated region 114 (and, optionally, over the one or more dummy bond pads 110E) of the first semiconductor device 100 to form conductive solder bumps 312 laterally offset to a first side of the centerline 309 of the semiconductor device package 300. Thus, the conductive solder bumps 312 laterally offset to the first side of the centerline 309 of the semiconductor device package 300 may be electrically connected to integrated circuitry of the second semiconductor device 200 through the data bond pads 210D, but not electrically connected to integrated circuitry of the first semiconductor device 100. Similarly, due to the lateral offset from the centerline 106 of the data bond pads 110D of the first semiconductor device 100 and the lateral offset from the centerline 206 of the electrically isolated region 214 (and, optionally, the one or more dummy bond pads 210E) of the second semiconductor device 200, the solder bumps 212 over the electrically isolated region 214 (and, optionally, over the one or more dummy bond pads 210E) of the second semiconductor device 200 may be aligned with and physically and electrically coupled to the solder bumps 112 over the data bond pads 110D of the first semiconductor device 100 to form conductive solder bumps 312 laterally offset to a second, opposite side of the centerline 309 of the semiconductor device package 300. The conductive solder bumps 312 laterally offset to the second, opposite side of the centerline 309 of the semiconductor device package 300 may be electrically connected to integrated circuitry of the first semiconductor device 100 through the data bond pads 110D, but not electrically connected to integrated circuitry of the second semiconductor device 200.

As a result of the configuration described above, data signals may be uniquely and separately passed between the substrate 302 and the first semiconductor device 100 and between the substrate 302 and the second semiconductor device 200, while other signals (e.g., address signals, command signals, and power signals) may be simultaneously passed between the substrate 302 and both of the first semiconductor device 100 and the second semiconductor device 200. If any other signals (e.g., command signals) are to be uniquely and separately passed between the substrate 302 and each of the first and second semiconductor devices 100, 200, then the bond pads 110, 210 (e.g., the command bond pads 110C, 210C) associated with such signals may be laterally offset from the respective centerlines 106, 206 as described above and illustrated in FIGS. 1 and 2. The layout of the bond pads 110, 210 of the respective first and second semiconductor devices 100, 200, described above with reference to FIGS. 1 and 2, may enable selective and separate electrical communication with certain bond pads 110, 210 and associated integrated circuitry of the first and second semiconductor devices 100, 200 without the need for redistribution layers in the respective first and second semiconductor devices 100, 200.

Accordingly, semiconductor device packages are disclosed herein. In some embodiments, the semiconductor device packages include a first semiconductor die and a second semiconductor die in facing relationship. At least one group of conductive solder bumps is substantially along a centerline between and the first and the second semiconductor dice and is operably coupled with integrated circuitry of the first semiconductor die and the second semiconductor die. At least another group of conductive solder bumps is laterally offset from and on a first side of the centerline and is operably coupled with only the integrated circuitry of the first semiconductor die. At least a further group of conductive solder bumps is laterally offset from and on a second, opposite side of the centerline and is operably coupled only with the integrated circuitry of the second semiconductor die.

In some embodiments, semiconductor device packages of the present disclosure include a first semiconductor device and a second semiconductor device. The first semiconductor device includes an active surface, at least one set of bond pads over the active surface and along a centerline of the first semiconductor device, and at least one other set of bond pads over the active surface and laterally offset from the centerline of the first semiconductor device. The second semiconductor device includes an active surface, at least one set of bond pads over the active surface and along a centerline of the second semiconductor device, and at least one other set of bond pads over the active surface and laterally offset from the centerline of the second semiconductor device. Conductive solder bumps of a set of conductive solder bumps are each physically and electrically coupled to the sets of bond pads along the respective centerlines of the first and second semiconductor devices. Conductive solder bumps of another set of conductive solder bumps are each physically and electrically coupled to one bond pad of the other set of bond pads laterally offset from the centerline of the first semiconductor device. Conductive solder bumps of a further set of conductive solder bumps are each physically and electrically coupled to one bond pad of the other set of bond pads laterally offset from the centerline of the second semiconductor device.

Referring again to FIGS. 1 through 3B, the semiconductor device package 300 may be formed by first fabricating the first semiconductor device 100 and the second semiconductor device 200 at the wafer or other bulk substrate level, followed by singulation into individual semiconductor dice 100, 200, etc., as known to those of ordinary skill in the art. The solder bumps 112, 212 may be formed over the respective first and second semiconductor devices 100, 200 in the locations described above with reference to FIGS. 1 and 2 prior to positioning the first and second semiconductor devices 100, 200 over the substrate 302. In some embodiments, the solder bumps 112, 212 may be formed over the first and second semiconductor devices 100, 200 when the first and second semiconductor devices 100, 200 are part of one or more semiconductor wafers or other bulk semiconductor substrates. In other embodiments, the solder bumps 112, 212 may be formed on each semiconductor die 100, 200 after singulation. Solder bumps 112 may, for example, comprise a tin-silver-copper solder with, optionally, zinc or manganese. The solder type selected is not material to implementation of embodiments of the present disclosure.

Figure 4:
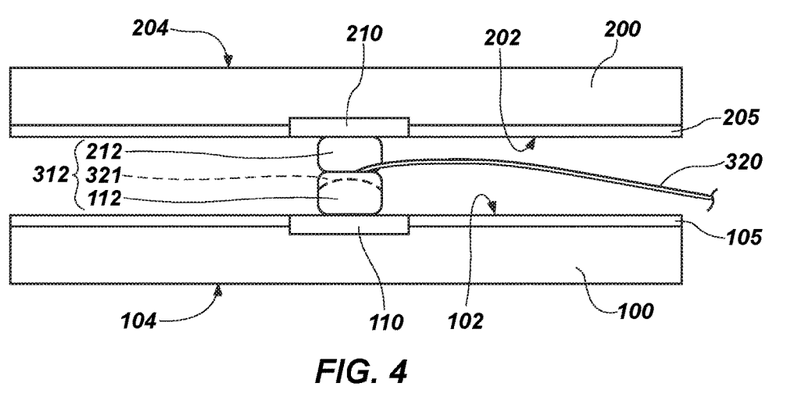
FIG. 4 shows an enlarged cross-sectional view of an conductive solder bump of a semiconductor device package according to an embodiment of the present disclosure.

Referring to FIG. 4, bond wires 320 may be connected to a top of the solder bump 112 such as using a so-called "stand-off stitch bonding" wire bonding process. Bond wires 320 may comprise aluminum, gold, silver or copper, as known to those of ordinary skill in the art, and the bond wire metal selected is not material to implementation of embodiments of the present disclosure. For example, the environment in which the wire bonding is to take place may be held at an elevated bond site temperature, such as between about 125° C. and about 150° C. A first end of a bond wire 320 may be melted and then at least partially cooled to form a ball of material 321 of the bond wire 320 bonded to a top of a solder bump 112 on a bond pad 110 of the semiconductor die 100. A second end of the bond wire 320 may be melted and cooled to form a ball of bond wire material 321 on a conductive pad 306 of the substrate 302 (see FIG. 3B), and then the bond wire 320 extended to bond with the ball of bond wire material 321 on solder bump 112. The bond wire 320 is then crushed or otherwise broken to form a second end that terminates at and is bonded with the ball of bond wire material 321 on the solder bump 112. Bonding may be facilitated by ultrasonic vibrations (e.g., thermosonic bonding), application of additional heat, and/or an electrical discharge.

Referring to FIGS. 2 through 4, after the bond wire 320 is coupled to and extended between the conductive pads 306 of the substrate 302 and the solder bumps 112 of the first semiconductor device 100, the second semiconductor device 200 may be positioned over and secured to the first semiconductor device 100. The second semiconductor device 200 may be inverted by rotating the second semiconductor device 200 about the centerline 206 thereof, or about another axis parallel to the centerline 206 (e.g., about one of the lateral edges 208). The second semiconductor device 200 may be aligned with the first semiconductor device 100 such that the solder bumps 212 of the second semiconductor device 200 are placed directly over the solder bumps 112 of the first semiconductor device 100. The solder bumps 112 of the first semiconductor device 100 and the solder bumps 212 of the second semiconductor device 200 may be heated and reflowed to form a physical and electrical bond therebetween and with the bond wires 320, and to form the conductive solder bumps 312 of the semiconductor device package 300. A dielectric underfill material 316 may be disposed between the first and second semiconductor devices 100, 200, to envelope the conductive solder bumps 312 and bond wires 320, and an encapsulant 318 may be formed, such as by molding, over the two-die stack 305 on the substrate 302, as is known in the art of semiconductor device packaging. In another approach, a molded dielectric underfill material may be used to fill between semiconductor dice 100, 200 and to encapsulate the two-die stack 305 of the first and second semiconductor dice 100, 200 on the substrate 302.

In other embodiments, stand-off stitch bonding may be employed to form flat-topped bumps of the bond wire material 321 on bond pads 110 of semiconductor die 100, after which a bond 320 wire is bonded to a conductive pad 306 of the substrate 302, and extended and bonded to a flat-topped bump on a bond pad 110. After all wire bonds have been effected between semiconductor die 100 and substrate 302, semiconductor die 200 having solder bumps 212 on bond pads 210 is inverted over and aligned with bond pads 110 of semiconductor die 100, and the assembly heated to reflow the solder bumps 212.

In yet other embodiments, the solder bumps 112 may be formed and the bond wire 320 may be coupled thereto and to conductive pads 306 on substrate 302 as described above, after which the solder bumps 212 may be applied directly over the solder bumps 112 (and the bumps of the bond wire material 321), and the interposed ends of the bond wires 320 on top of solder bumps 112 to form the conductive solder bumps 312, rather than forming the solder bumps 212 on the second semiconductor device 200 prior to aligning and connecting the second semiconductor device 200 to the first semiconductor device 100. In such alternative embodiments, after the solder bumps 212 are applied directly over the solder bumps 112 and the interposed ends of the bond wires 320, the bond pads 210 of the second semiconductor device 200 (lacking solder bumps thereon) may be aligned with and physically and electrically coupled by solder reflow to the conductive solder bumps 312 formed over the bond pads 110 (and over the electrically isolated region 114) of the first semiconductor device 100. Other processes for completing the formation of the semiconductor device package 300 according to the alternative embodiments may be substantially the same as those described above.

Accordingly, methods of forming a semiconductor device package are disclosed herein. In accordance with such methods, a back side of a first semiconductor die is secured to a substrate. The first semiconductor die includes bond pads over an active surface and along a centerline thereof, and additional bond pads over the active surface and laterally offset from the centerline thereof. A second semiconductor die is aligned with the first semiconductor die with an active surface thereof facing the active surface of the first semiconductor die. The second semiconductor die includes bond pads over the active surface and along a centerline thereof, and additional bond pads over the active surface and laterally offset from the centerline thereof. The bond pads along the respective centerlines of the first and second semiconductor dice are substantially aligned with each other. The bond pads along the centerline of the first semiconductor die are physically and electrically coupled with the bond pads along the centerline of the second semiconductor die using conductive solder bumps.

The embodiments of the disclosure described above and illustrated in the accompanying drawing figures do not limit the scope of the invention, since these embodiments are merely examples of embodiments of the disclosure. The invention is encompassed by the appended claims and their legal equivalents. Any equivalent embodiments lie within the scope of this disclosure. Indeed, various modifications of the present disclosure, in addition to those shown and described herein, such as other combinations and modifications of the elements described, will become apparent to those of ordinary skill in the art from the description. Such embodiments, combinations, and modifications also fall within the scope of the appended claims and their legal equivalents.

What is claimed is:

1. A method of forming a semiconductor device package, the method comprising:
    securing a back side of a first semiconductor die to a substrate, the first semiconductor die comprising a first bond pad over an active surface and located and centered on a centerline thereof, a second bond pad over the active surface and laterally offset from the centerline thereof, and an electrically isolated region over the active surface and laterally offset from the centerline thereof, the centerline of the first semiconductor die defined substantially midway between and parallel to opposing lateral edges of the active surface;
    aligning a second semiconductor die with the first semiconductor die with an active surface of the second semiconductor die facing the active surface of the first semiconductor die, the second semiconductor die comprising a third bond pad over the active surface and located and centered on a centerline thereof, a fourth bond pad over the active surface and laterally offset from the centerline thereof, and an electrically isolated region over the active surface and laterally offset from the centerline thereof, the centerline of the second semiconductor die defined substantially midway between and parallel to opposing lateral edges of the active surface, the aligning comprising:
        substantially aligning the first and third bond pads along respective centerlines of the first and second semiconductor dice with each other;
        substantially aligning the second bond pad of the first semiconductor die and the electrically isolated region of the second semiconductor die with each other on a first side of the respective centerlines of the first and second semiconductor dice; and
        substantially aligning the fourth bond pad of the second semiconductor die and the electrically isolated region of the first semiconductor die with each other on a second side of the respective centerlines of the first and second semiconductor dice opposite the first side; and
    physically and electrically coupling the first bond pad along the centerline of the first semiconductor die with the third bond pad along the centerline of the second semiconductor die using conductive elements.

2. The method of claim 1, further comprising:
    forming each of the first and the second semiconductor dice, comprising:

forming the first and third bond pads over the active surface and located and centered on the respective centerlines of the first and second semiconductor dice; and forming the second and fourth bond pads over the active surface and laterally offset from the respective centerlines of the first and second semiconductor dice.

3. The method of claim 2, wherein:

forming each of the first and the second semiconductor dice further comprises forming dummy bond pads over the active surface and laterally offset from the respective centerlines of the first and second semiconductor dice, the dummy bond pads electrically isolated from integrated circuitry of the respective first and second semiconductor dice;

substantially aligning the second bond pad and the electrically isolated region of the second semiconductor die with each other comprises aligning the second bond pad and the dummy bond pad of the second semiconductor die with each other; and substantially aligning the fourth bond pad and the electrically isolated region of the first semiconductor die with each other comprises aligning the fourth bond pad and the dummy bond pad of the first semiconductor die with each other.

4. The method of claim 1, further comprising coupling conductive bond wires to and between conductive pads of the substrate and the conductive elements.

5. The method of claim 1, wherein aligning further comprises:

operably coupling the first and third bond pads located and centered on the respective centerlines of the first semiconductor die and the second semiconductor die to integrated circuitry of both the first semiconductor die and the second semiconductor die;

operably coupling the second bond pad over the active surface and offset from the centerline of the first semiconductor die only with the integrated circuitry of the first semiconductor die; and operably coupling the fourth bond pad over the active surface and offset from the centerline of the second semiconductor die only with the integrated circuitry of the second semiconductor die.

6. The method of claim 1, further comprising physically coupling the second bond pad along the active surface and laterally offset from the centerline of the first semiconductor die with the electrically isolated region of the second semiconductor die using conductive elements.

7. The method of claim 1, further comprising physically coupling the fourth bond pad along the active surface and laterally offset from the centerline of the second semiconductor die with the electrically isolated region of the first semiconductor die using conductive elements.

8. The method of claim 1, wherein securing a back side of a first semiconductor die to a substrate comprises securing the back side of the first semiconductor die to one of an interposer substrate, a leadframe, or a circuit board.

9. The method of claim 1, further comprising providing the first semiconductor die having a size, shape, and configuration and providing the second semiconductor die having substantially the same size, shape, and configuration as the first semiconductor die.

10. The method of claim 1, further comprising respectively connecting bond wires to the first bond pad located and centered on the centerline of the first semiconductor die.

11. The method of claim 1, further comprising respectively connecting bond wires to the second bond pad laterally offset from the centerline of the first semiconductor die.

12. A semiconductor device package, comprising:

a first semiconductor die and a second semiconductor die, wherein each of the first semiconductor die and the second semiconductor die comprises a centerline defined substantially midway between and parallel to opposing lateral edges of the first semiconductor die and the second semiconductor die, respectively;

a first group of conductive elements substantially along the respective centerlines of the first and the second semiconductor dice and operably coupled with integrated circuitry of the first semiconductor die and the second semiconductor die, the first group of conductive elements located equidistant from the opposing lateral edges of the respective first semiconductor die and the second semiconductor die;

a second group of conductive elements laterally offset from and on a first side of the centerline and operably coupled with only the integrated circuitry of the first semiconductor die;

a third group of conductive elements laterally offset from and on a second side of the centerline opposite the first side and operably coupled with only the integrated circuitry of the second semiconductor die.

13. The semiconductor device package of claim 12, wherein the conductive elements of the first group, of the second group, and of the third group comprise conductive solder bumps.

14. The semiconductor device package of claim 12, wherein the first semiconductor die has the same shape, size, and configuration as the second semiconductor die.

15. The semiconductor device package of claim 12, wherein the second group of conductive elements is arranged along a first line substantially parallel to the centerline and the third group of conductive elements is arranged along a second line substantially parallel to the centerline.

16. A semiconductor device package, comprising:

a first semiconductor device comprising an active surface, a first set of bond pads over the active surface and located and centered on a centerline of the first semiconductor device, a second set of bond pads over the active surface and laterally offset from the centerline of the first semiconductor device, and a third set of bond pads over the active surface and laterally offset from the centerline of the first semiconductor device, the centerline of the first semiconductor die defined substantially midway between and parallel to opposing lateral edges of the active surface;

a second semiconductor device, comprising an active surface, a fourth set of bond pads over the active surface and located and centered on a centerline of the second semiconductor device, a fifth set of bond pads over the active surface and laterally offset from the centerline of the second semiconductor device, and a sixth set of bond pads over the active surface and laterally offset from the centerline of the second semiconductor device, the centerline of the second semiconductor die defined substantially midway between and parallel to opposing lateral edges of the active surface;

a first set of conductive elements each physically and electrically coupled to the first and fourth sets of bond pads along the respective centerlines of the first and second semiconductor devices;

a second set of conductive elements each physically coupled to the second and fifth sets of bond pads laterally offset from the centerline of the first and the second semiconductor devices, the second set of conductive elements each electrically coupled only to integrated circuitry of the first semiconductor device through the second set of bond pads; and a third set of conductive elements each physically coupled to the third and sixth sets of bond pads laterally offset from the centerline of the first and the second semiconductor devices, the third set of conductive elements each electrically coupled only to integrated circuitry of the second semiconductor device through the sixth set of bond pads.

17. The semiconductor device package of claim 16, further comprising a substrate attached to a back side surface of the first semiconductor device, the substrate selected from the group consisting of an interposer substrate, a leadframe, or a circuit board.

18. The semiconductor device package of claim 16, further comprising a dielectric underfill material between the first semiconductor die and the second semiconductor die and an encapsulant over the first semiconductor die and the second semiconductor die.

19. The semiconductor device package of claim 16, wherein each of the third and sixth sets of bond pads comprises a dummy bond pad electrically isolated from integrated circuitry of the respective first and second semiconductor die.

20. The semiconductor device package of claim 16, wherein the second and fifth sets of bond pads are laterally offset from the respective centerline of the first and the second semiconductor devices on a first side of the respective centerline and the third and sixth sets of bond pads are laterally offset from the respective centerline of the first and the second semiconductor devices on a second side opposite the first side of the respective centerline.

* * * * *